US011513241B2

(12) United States Patent
Chung et al.

(10) Patent No.: US 11,513,241 B2
(45) Date of Patent: Nov. 29, 2022

(54) DETECTION SUBSTRATE, DETECTION PANEL AND PHOTO DETECTION DEVICE

(71) Applicants: Beijing BOE Sensor Technology Co., Ltd., Beijing (CN); BOE Technology Group Co., Ltd., Beijing (CN)

(72) Inventors: Kunjing Chung, Beijing (CN); Xuecheng Hou, Beijing (CN)

(73) Assignees: Beijing BOE Sensor Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 396 days.

(21) Appl. No.: 16/860,233

(22) Filed: Apr. 28, 2020

(65) Prior Publication Data

US 2021/0141101 A1    May 13, 2021

(30) Foreign Application Priority Data

Nov. 8, 2019    (CN) .......................... 201911087068.7

(51) Int. Cl.
  *G01T 1/20*     (2006.01)
  *H01L 27/146*   (2006.01)
  *G01T 1/208*    (2006.01)

(52) U.S. Cl.
  CPC .......... *G01T 1/208* (2013.01); *G01T 1/20186* (2020.05); *H01L 27/14612* (2013.01); *H01L 27/14636* (2013.01); *H01L 27/14643* (2013.01); *H01L 27/14663* (2013.01)

(58) Field of Classification Search
  CPC ................. G01T 1/20186; G01T 1/208; H01L 27/14612; H01L 27/14636; H01L 27/14643; H01L 27/14663
  See application file for complete search history.

(56) References Cited

U.S. PATENT DOCUMENTS

| 2009/0046180 | A1* | 2/2009 | Shibano | ................. | H04N 5/361 |
| | | | | | 348/E9.037 |
| 2011/0114842 | A1* | 5/2011 | Ji | .......................... | G01S 7/4868 |
| | | | | | 250/340 |
| 2014/0193164 | A1* | 7/2014 | Ide | ..................... | H04B 10/6933 |
| | | | | | 398/210 |
| 2015/0338274 | A1* | 11/2015 | Frank | .................... | G01J 1/4228 |
| | | | | | 250/208.2 |
| 2019/0324163 | A1* | 10/2019 | Taguchi | ............... | H04N 5/3651 |

\* cited by examiner

*Primary Examiner* — Mark R Gaworecki

(74) *Attorney, Agent, or Firm* — ArentFox Schiff LLP; Michael Fainberg

(57) ABSTRACT

Detection substrate, detection panel and photoelectric detection device are provided. The detection substrate includes: a detection region and a non-detection region surrounding the detection region, wherein the detection region includes a plurality of detection units in an array and a plurality of bias voltage lines; each of the detection units includes: a driving circuit, and a photoelectric conversion circuit electrically connected with the driving circuit; wherein the bias voltage lines are electrically connected with the photoelectric conversion circuits; the non-detection region comprises: input terminals electrically connected with the bias voltage lines, and voltage compensation circuits electrically connected between the input terminals and the bias voltage lines; and the voltage compensation circuits are configured to offset a voltage generated by the photoelectric conversion circuits under ambient light in a manufacturing process of the detection substrate.

10 Claims, 6 Drawing Sheets

DETECTION SUBSTRATE, DETECTION PANEL AND PHOTO DETECTION DEVICE

CROSS-REFERENCES TO RELATED APPLICATION

This application claims priority to Chinese patent application No. 201911087068.7 filed on Nov. 8, 2019, which is incorporated herein by reference in its entirety.

FIELD

The present disclosure relates to the technical field of photo detection, and particularly to a detection substrate, a detection panel and a photo detection device.

BACKGROUND

A Flat X-ray Panel Detector (FPXD) manufactured based on a Thin Film Transistor (TFT) technology is a crucial element in a digital imaging technology. Due to its advantages of high imaging speed, good space and density resolution, high signal-to-noise ratio, direct digital output and the like, the FPXD is widely used in medical imaging (such as X-ray chest radiography), industrial detection (such as metal flaw detection), security detection, air transportation and other fields.

SUMMARY

In one aspect, an embodiment of the present disclosure provides a detection substrate. The detection substrate includes: a detection region and a non-detection region surrounding the detection region. The detection region includes a plurality of detection units in an array and a plurality of bias voltage lines. Each detection unit includes: a driving circuit, and a photoelectric conversion circuit electrically connected with the driving circuit. The bias voltage lines are electrically connected with the photoelectric conversion circuits. The non-detection region includes: input terminals electrically connected with the bias voltage lines, and voltage compensation circuits electrically connected between the input terminals and the bias voltage lines. The voltage compensation circuits are configured to offset a voltage generated by the photoelectric conversion circuits under ambient light in the manufacturing process of the detection substrate.

Optionally, in an implementation, in the above detection substrate provided by the embodiment of the present disclosure, each column of detection units is correspondingly electrically connected with the same bias voltage line, and one voltage compensation circuit is electrically connected between each of the input terminals and the corresponding bias voltage line.

Optionally, in an implementation, in the above detection substrate provided by the embodiment of the present disclosure, the photoelectric conversion circuit includes a photodiode, and the voltage compensation circuit includes a compensation photodiode.

The photodiode and the compensation photodiode have opposite bias polarities.

Optionally, in an implementation, in the above detection substrate provided by the embodiment of the present disclosure, a first electrode of the photodiode is electrically connected with a first electrode of the compensation photodiode. A second electrode of the compensation photodiode is electrically connected with the corresponding input terminal, and a second electrode of the photodiode is electrically connected with the driving circuit. The bias voltage line is configured to load a negative voltage to the first electrode of the photodiode.

Optionally, in an implementation, in the above detection substrate provided by the embodiment of the present disclosure, the driving circuit includes a driving transistor. A gate of the driving transistor is electrically connected with a control signal terminal. A first electrode of the driving transistor is electrically connected with the second electrode of the photodiode. A second electrode of the driving transistor is electrically connected with a digital signal terminal.

Optionally, in an implementation, in the above detection substrate provided by the embodiment of the present disclosure, the second electrode of the photodiode is electrically connected with the second electrode of the compensation photodiode. The first electrode of the compensation photodiode is electrically connected with the input terminal, and the first electrode of the photodiode is electrically connected with the driving circuit. The bias voltage line is configured to load a positive voltage to the second electrode of the photodiode.

Optionally, in an implementation, in the above detection substrate provided by the embodiment of the present disclosure, the driving circuit includes a driving transistor. A gate of the driving transistor is electrically connected with a control signal terminal. A first electrode of the driving transistor is electrically connected with the first electrode of the photodiode. A second electrode of the driving transistor is electrically connected with a digital signal terminal.

Optionally, in an implementation, in the above detection substrate provided by the embodiment of the present disclosure, the photodiode and the compensation photodiode have same film layers and are in same layer.

In another aspect, an embodiment of the present disclosure further provides a detection panel, including any one of the detection substrates provided by the embodiments of the present disclosure, and a scintillator layer on a light entering side of the detection substrate. The scintillator layer only covers the detection region.

In another aspect, an embodiment of the present disclosure further provides a photo detection device, including the above detection panel provided by the embodiment of the present disclosure.

DETAILED DESCRIPTION

Figure 1:
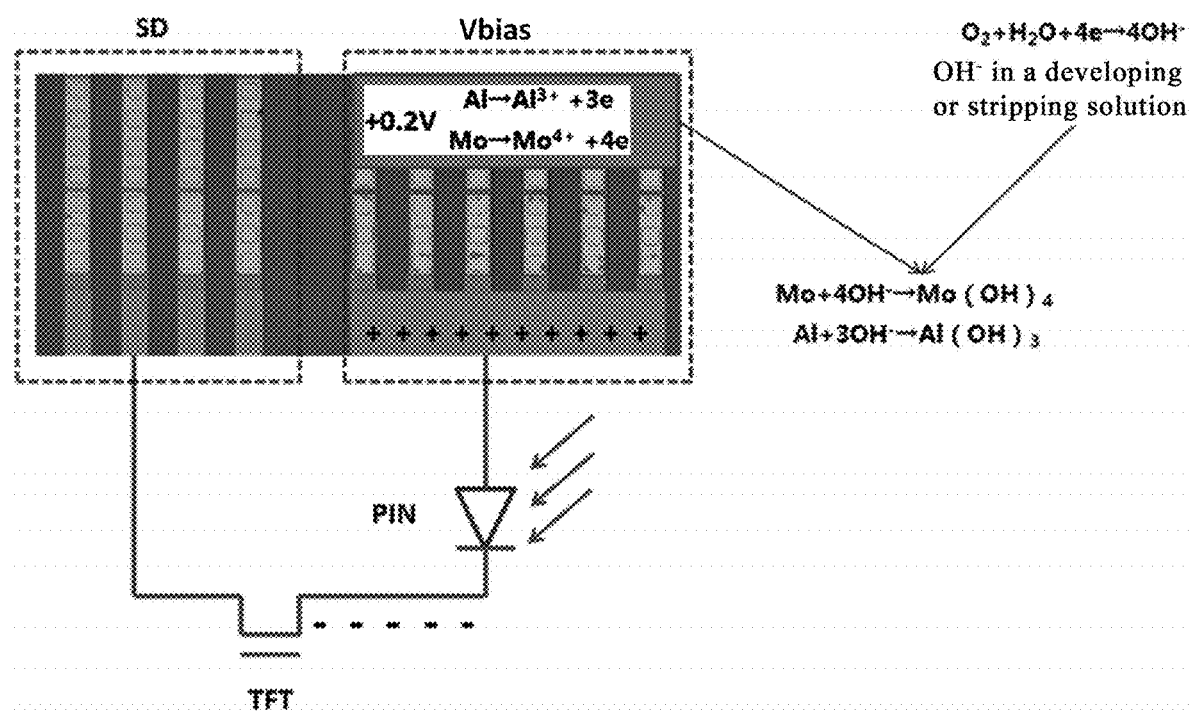
FIG. 1 is a schematic structural diagram of a detection substrate in the related art.

In order to make objects, technical solutions and advantages of the present disclosure clearer, a detection substrate, a detection panel and a photoelectric detection device provided by the present disclosure will be further described below in detail in conjunction with the accompanying drawings. Obviously, the embodiments described are only one part of embodiments of the present disclosure, but not all the embodiments. Based on the embodiments in the present disclosure, all other embodiments obtained by those ordinarily skilled in the art without doing creative work shall fall within the scope of the present disclosure.

The shapes and sizes of all components in the drawings do not reflect real scales, and are merely to illustrate the contents of the present disclosure.

The FPXDs are divided into a direct type and an indirect type. The indirect type includes a Charge Coupled Device (CCD), a Complementary Metal-Oxide-Semiconductor Transistor (CMOS), amorphous silicon and other types. An amorphous silicon flat detector has a larger imaging area and lower distortion than CMOS and CCD flat detectors. The imaging principle of the indirect type flat detector is as follows: X-ray is irradiated to the inside of the detector, and firstly passes through a scintillator, the function of the scintillator is to convert the X-ray into visible light; then, the visible light is incident to a glass back panel, wherein the glass back panel includes a photodiode and a switch circuit (such as a TFT); the photodiode receives the visible light to excite electrons to a capacitor for storage; then, a Gate side driving circuit turns on the switch circuit line by line for scanning. A signal is read by a Data side. A chip converts an analog signal into a digital signal, and finally the signal is presented as an image.

In the related art, the detection substrate generally includes a plurality of detection regions, as shown in FIG. 1. Each detection region includes: a switch circuit TFT, a photodiode PIN electrically connected with the switch circuit TFT, and a bias voltage line Bias electrically connected with the photodiode PIN. After various structures on the detection substrate are manufactured completely, they are subjected to processes such as processing, assembling and transportation under illumination of normal ambient light. The photodiodes PIN would generate a voltage under irradiation of the ambient light. The voltage is transmitted to the bias voltage lines Bias, so that the bias voltage lines Bias have a potential. When tested by a multimeter, the bias voltage lines Bias under a dark environment have no potential, the bias voltage lines Bias under an LED lamp have a potential of +0.2 V, and the bias voltage lines Bias under sunlight have a potential of +0.7 V. As the illumination intensity increases, the potential on the bias voltage lines Bias is gradually increased. Since each structure of the detection substrate generally uses a pattern process in a manufacturing process, and the pattern process requires development, stripping and other processes, a developing or stripping solution will be unavoidably left on the detection substrate. A material of the bias voltage lines Bias is generally metal Mo, Al and the like, and the developing or stripping solution contains $OH^-$. When the bias voltage lines Bias contact the developing or stripping solution, the potential on the bias voltage lines Bias provides kinetic energy for its electrochemical corrosion, so that an electrochemical reaction occurs, which accelerates the corrosion. Therefore, the bias voltage lines Bias having the potential are easily electrochemically corroded in an environment with the developing or stripping solution, thereby affecting the service life of a product and reducing reliability of the product.

Figure 2:
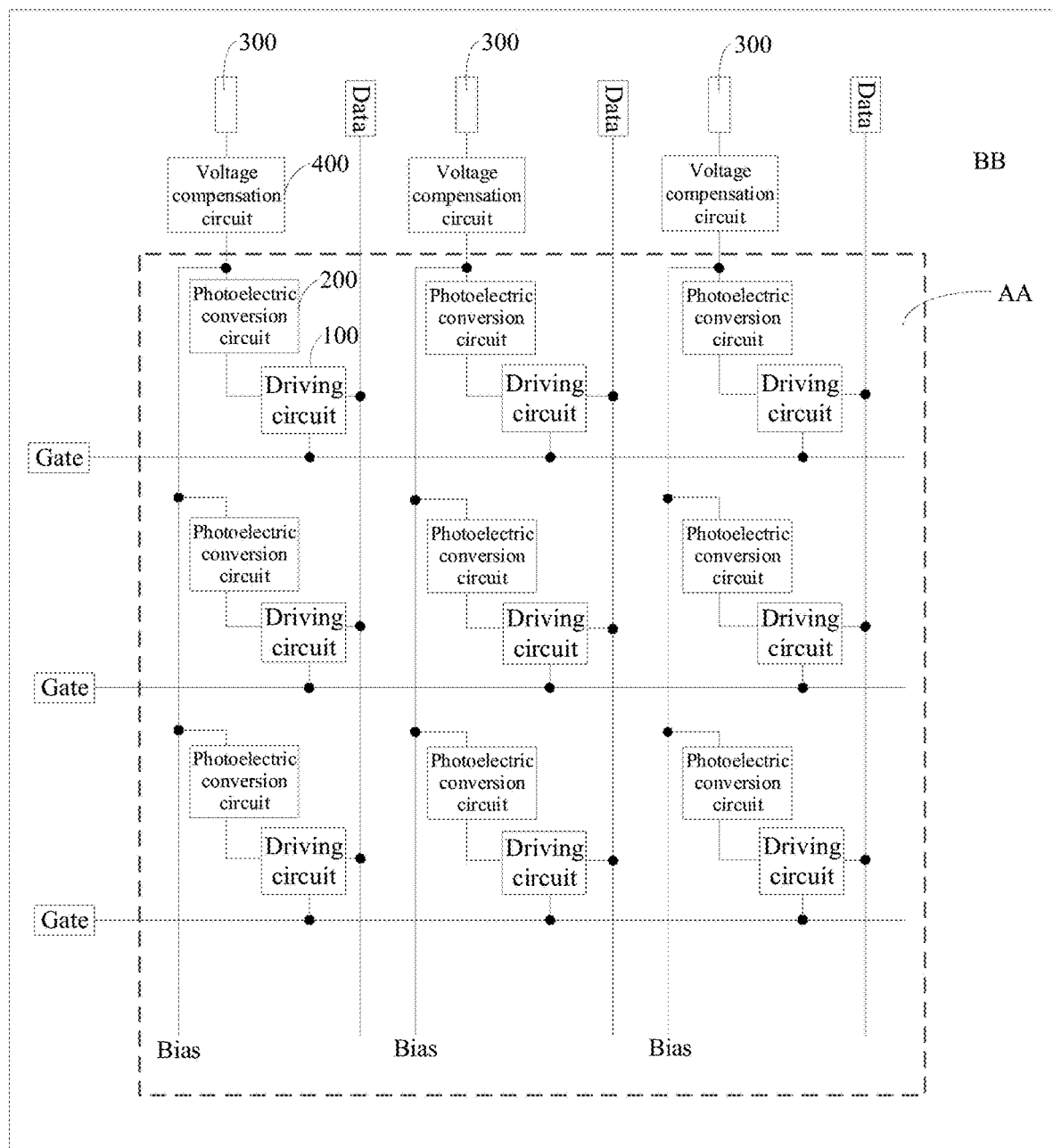
FIG. 2 is a schematic structural diagram of a detection substrate according to an embodiment of the present disclosure.

In view of this, an embodiment of the present disclosure provides a detection substrate. As shown in FIG. 2, the detection substrate includes a detection region AA and a non-detection region BB surrounding the detection region AA. The detection region AA includes a plurality of detection units in an array and a plurality of bias voltage lines Bias. Illustration is made by taking 3*3 detection units for example in FIG. 1. Each detection unit includes: a driving circuit 100, and a photoelectric conversion circuit 200 electrically connected with the driving circuit 100. The bias voltage lines Bias are electrically connected with the photoelectric conversion circuits 200.

The non-detection region BB includes: input terminals 300 electrically connected with the plurality of bias voltage lines Bias, and voltage compensation circuits 400 electrically connected between the input terminals 300 and the bias voltage lines Bias.

The voltage compensation circuits 400 are configured to counteract a voltage generated by the photoelectric conversion circuits 200 under ambient light in a manufacturing process of the detection substrate.

The above detection substrate according to the embodiment of the present disclosure is unavoidably exposed to the ambient light during manufacturing of the detection substrate (such as processing, assembling and transportation), and the photoelectric conversion circuits 200 generate a voltage when they are illuminated by the ambient light. The voltage is transmitted to the bias voltage lines Bias, so that the bias voltage lines Bias have a potential. Since each film layer of the detection substrate generally uses a pattern process in the manufacturing process, and the pattern process requires development, stripping and other processes, a developing or stripping solution will be unavoidably left on the detection substrate. Therefore, when the bias voltage lines Bias contact the developing or stripping solution, the potential on the bias voltage lines Bias provide kinetic energy for its electrochemical corrosion. The voltage compensation circuits 400 are disposed between the input terminals 300 and the bias voltage lines Bias. Under irradiation of the ambient light, the voltage compensation circuits 400 and the photoelectric conversion circuits 200 generate opposite voltages. Therefore, the voltage compensation circuits 400 may offset the voltage generated by the photoelectric conversion circuits 200 under the ambient light in the manufacturing process of the detection substrate to avoid potential accumulation on the bias voltage lines Bias, thereby solving the problem that the bias voltage lines Bias having the potential are easily electrochemically corroded in an environment with the developing or stripping solution, prolonging the service life of a product, and improving reliability of the product.

In addition, the voltage compensation circuits of the present disclosure are disposed in the non-detection region, so that the voltage compensation circuits would neither occupy a space of the detection region, nor affect photoelectric detection of the detection region.

In some embodiments, in the implementation, in the above detection substrate according to the embodiment of the present disclosure, as shown in FIG. 1, each column of detection units are correspondingly electrically connected with the same bias voltage line Bias, and one voltage compensation circuit 400 is electrically connected between each input terminal 300 and the corresponding bias voltage line Bias. In this way, the photoelectric conversion circuits 200 electrically connected to the same bias voltage line Bias are equivalent to being connected in parallel. In order to prevent the electrochemical corrosion in the bias voltage line Bias, one voltage compensation circuit 400 needs to be electrically connected between the input terminal 300 electrically connected with the bias voltage line Bias and the bias voltage wire Bias only. Since each column of detection units corresponds to one voltage compensation circuit 400, all the bias voltage lines Bias in the detection substrate of the present disclosure would not be electrochemically corroded, thereby further prolonging the service life of the product and further improving the reliability of the product.

The structure of the detection substrate according to the present disclosure is explained and illustrated below through some embodiments.

Figure 3:
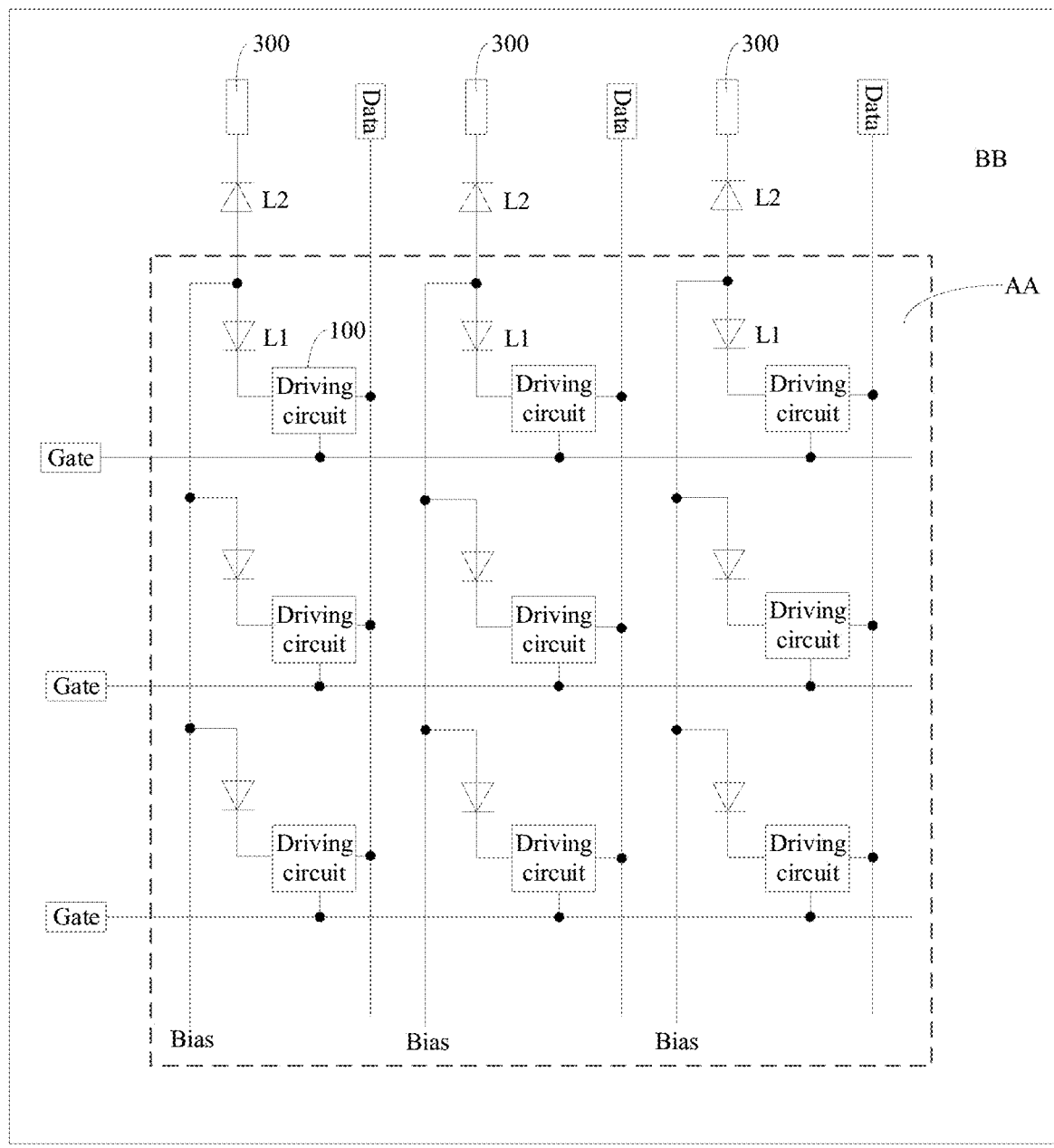
FIG. 3 is a schematic structural diagram of another detection substrate according to an embodiment of the present disclosure.
Figure 4:
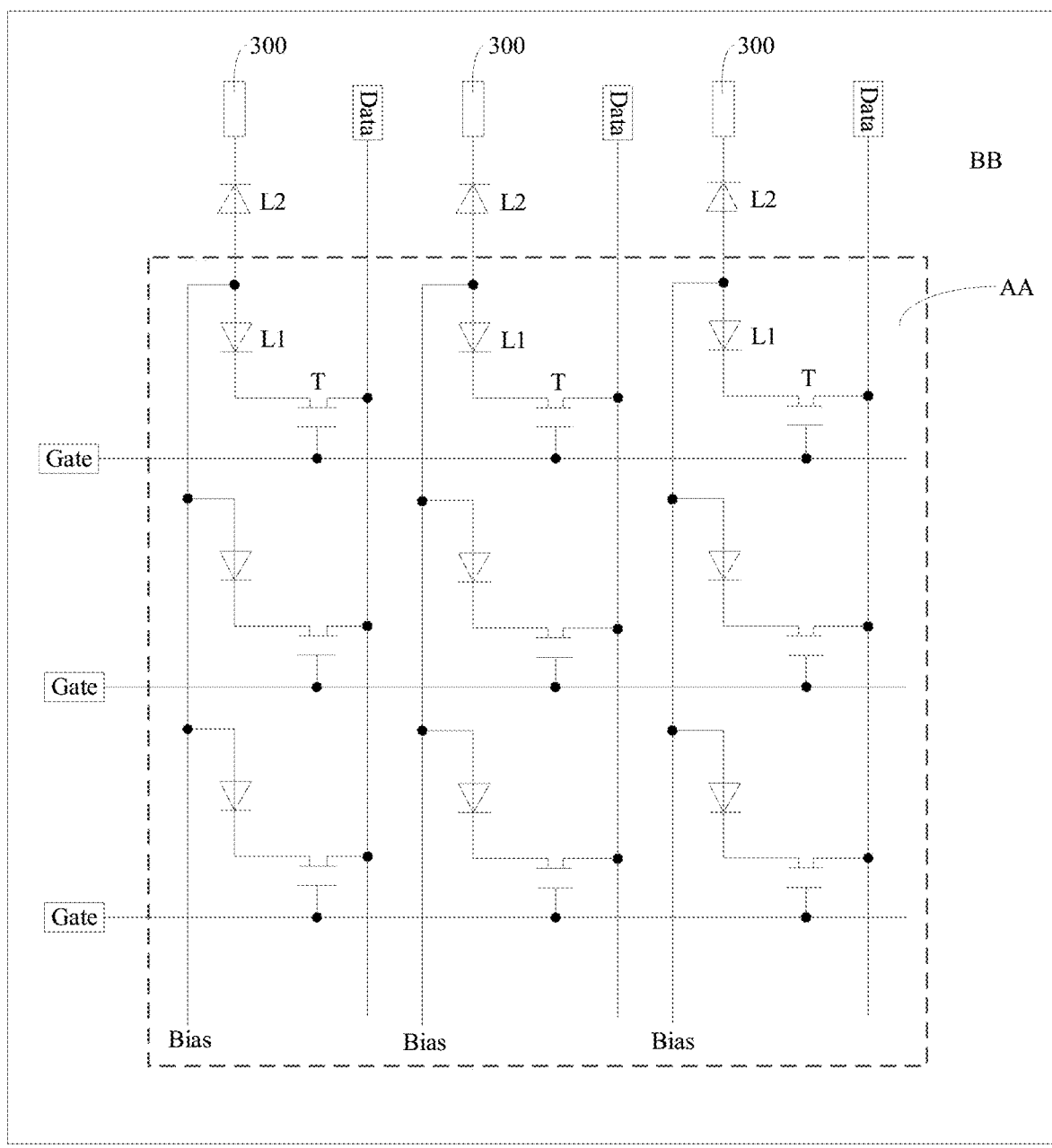
FIG. 4 is a schematic structural diagram of another detection substrate according to an embodiment of the present disclosure.

In some embodiments, in the implementation, in the above detection substrate according to the embodiment of the present disclosure, as shown in FIG. 3 and FIG. 4, each of the photoelectric conversion circuits 200 includes a photodiode L1, and each of the voltage compensation circuits 400 includes a compensation photodiode L2.

The photodiode L1 and the compensation photodiode L2 have opposite bias polarities. Therefore, under the irradiation of the ambient light, a voltage generated by the compensation photodiode L2 is opposite to a voltage generated by the photodiode L1, which offset each other. Therefore, the bias voltage line Bias would have no potential, and no electrochemical corrosion would occur, thus prolonging the service life of the product and improving the reliability of the product.

In some embodiments, in the implementation, in the detection substrate according to the embodiment of the present disclosure, as shown in FIG. 3, first electrodes of the photodiodes L1 are electrically connected with first electrodes of the compensation photodiodes L2. Second electrodes of the compensation photodiodes L2 are electrically connected with the input terminals 300, and second electrodes of the photodiodes L1 are electrically connected with the driving circuits 100.

The photodiodes L1 work under a reverse bias, so that the bias voltage lines Bias are configured to load a negative voltage to the first electrodes of the photodiodes L1.

In some embodiments, in the implementation, in the above detection substrate according to the embodiment of the present disclosure, as shown in FIG. 4, each of the driving circuits 100 includes a driving transistor T. The Gate of the driving transistor T is electrically connected with a control signal terminal Gate. The First electrode of the driving transistor T is electrically connected with the second electrode of the photodiode L1. The second electrode of the driving transistor T is electrically connected with a digital signal terminal Data.

Specifically, as shown in FIG. 4, under the irradiation of the ambient light, holes in the photodiodes L1 are accumulated to the first electrodes of the photodiodes L1, and holes of the compensation photodiodes L2 are accumulated to the first electrodes of the compensation photodiodes L2. Since the photodiodes L1 and the compensation photodiodes L2 have the opposite bias polarities, the photodiodes L1 and the compensation photodiodes L2 form opposite potentials. Since the photodiodes L1 and the compensation photodiodes L2 are connected in series, the potential of the compensation photodiodes L2 prevents the potential of the photodiodes L1 from being transmitted to the bias voltage lines Bias. Thus, the bias voltage lines Bias would have no potential, and no electrochemical corrosion would occur, thereby prolonging the service life of the product and improving the reliability of the product.

In an implementation, as shown in FIG. 4, during photoelectric detection, a negative voltage is input into the second electrodes of the compensation photodiodes L2 through the input terminals 300. It is assumed that the input terminals 300 input a voltage of −5 V, and at this time, the first electrodes of the photodiodes L1 is in a floating state, so that a voltage of the first electrodes of the photodiodes L1 may be more than −5 V or less than −5 V. It is assumed that the voltage of the first electrodes of the photodiodes L1 is more than −5 V, such as 0. Since the compensation photodiodes L2 have a one-way conduction characteristic, when the voltage of −5 V is input into the second electrodes of the compensation photodiodes L2 through input terminals 300, the one-way conduction characteristic may enable the voltage of the first electrodes of the compensation photodiodes L2, i.e., the voltage of the first electrodes of the photodiodes L1, to be −5 V, so that the compensation photodiodes L2 may not affect an external bias of the first electrodes of the photodiodes L1. Similarly, when it is assumed that the voltage of the first electrodes of the photodiodes L1 is less than −5 V, the one-way conduction characteristic may also enable the voltage of the first electrodes of the photodiodes L1 to be −5 V, so that the compensation photodiodes L2 may not affect the external bias of the first electrodes of the photodiodes L1.

Figure 5:
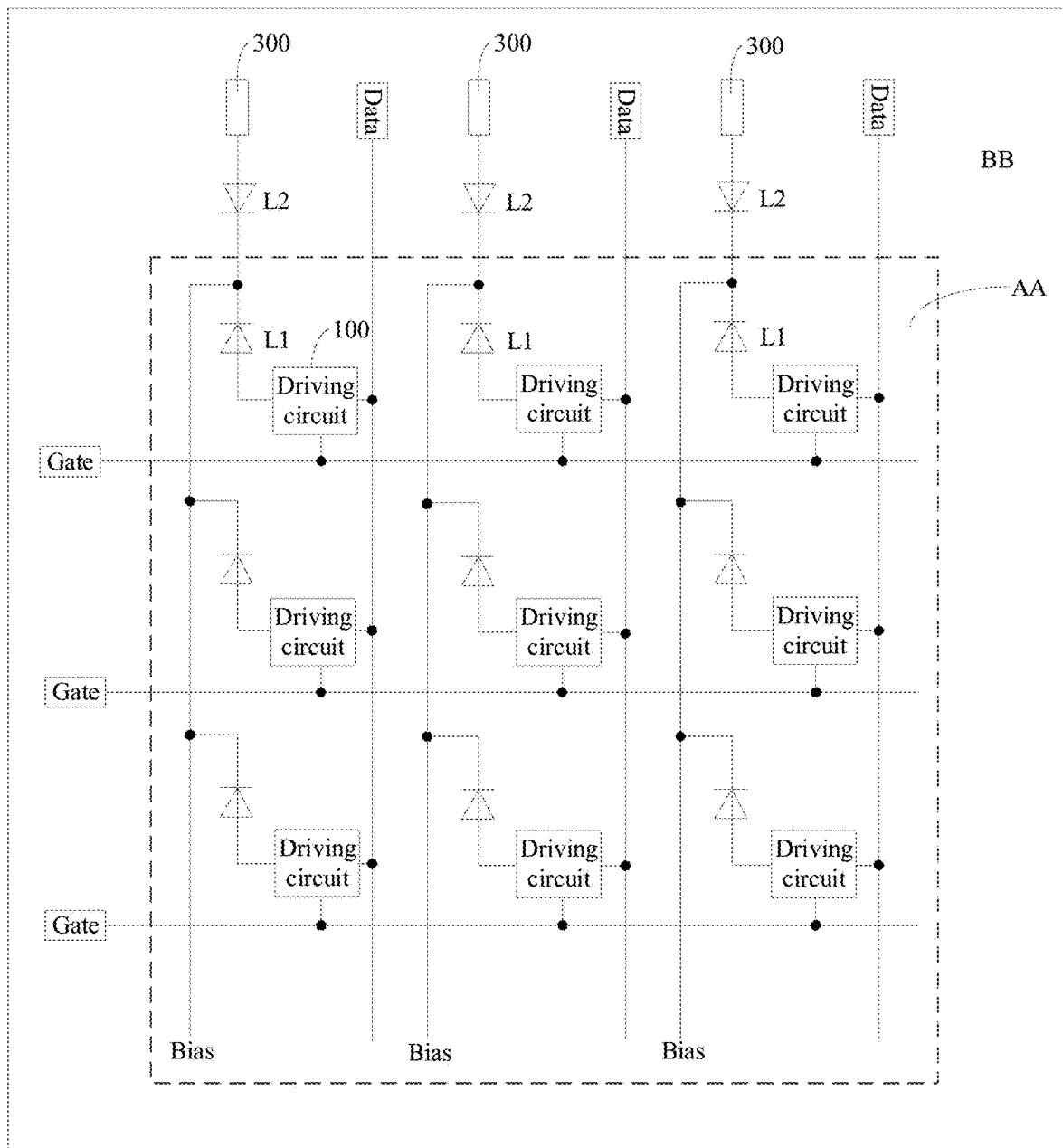
FIG. 5 is a schematic structural diagram of another detection substrate according to an embodiment of the present disclosure.

In some embodiments, in an implementation, in the above detection substrate according to the embodiment of the present disclosure, as shown in FIG. 5, the second electrodes of the photodiodes L1 are electrically connected with the second electrodes of the compensation photodiodes L2. The first electrodes of the compensation photodiodes L2 are electrically connected with the input terminals 300, and the first electrodes of the photodiodes L1 are electrically connected with the driving circuits 100.

The photodiodes L1 work under a reverse bias, so that the bias voltage lines Bias are configured to load a positive voltage to the second electrodes of the photodiodes L1.

Figure 6:
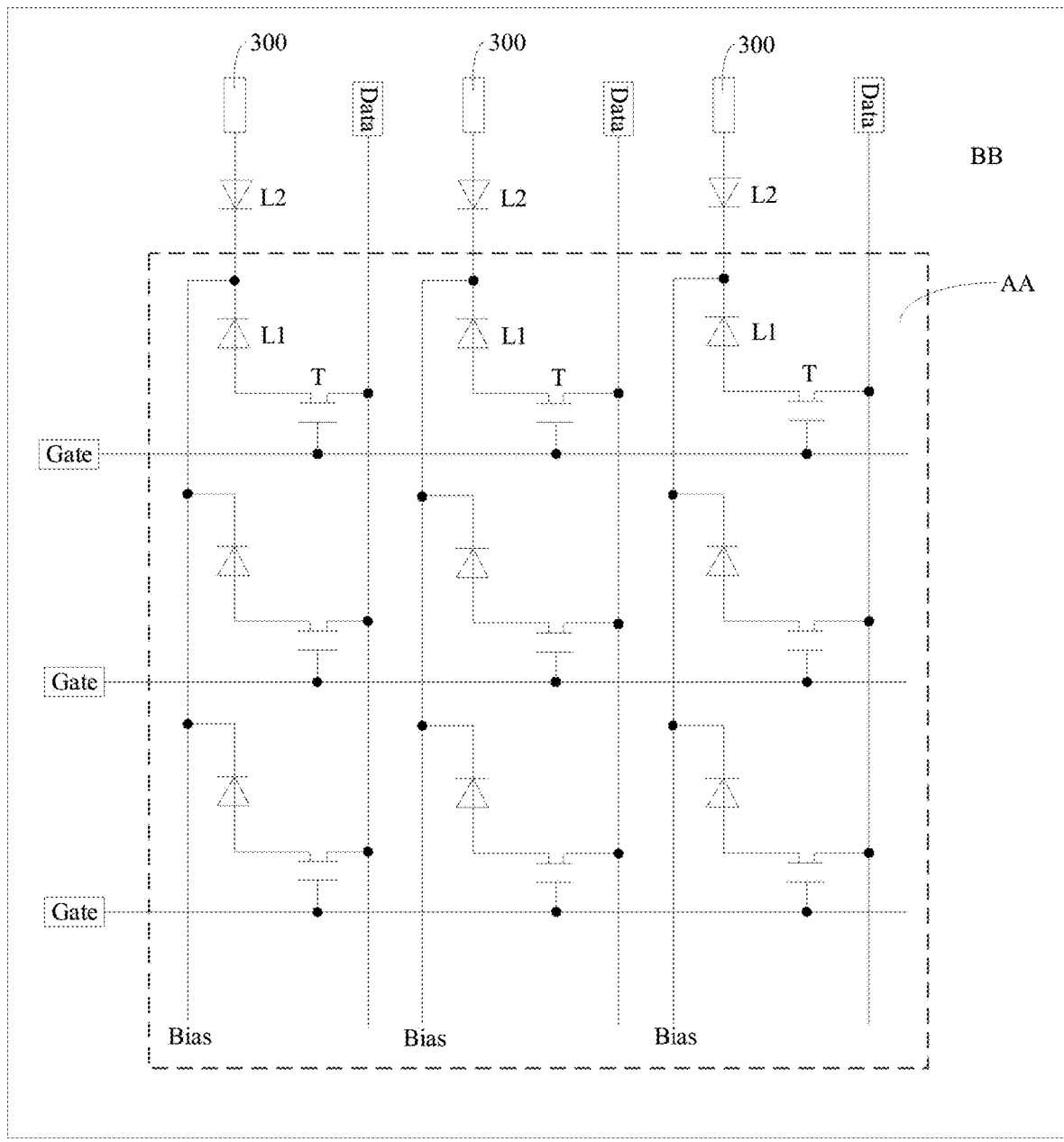
FIG. 6 is a schematic structural diagram of another detection substrate according to an embodiment of the present disclosure.

In some embodiments, in an implementation, in the above detection substrate according to the embodiment of the present disclosure, as shown in FIG. 6, each of the driving circuits 100 includes a driving transistor T. The gate of the driving transistor T is electrically connected with a control signal terminal Gate. The first electrode of the driving transistor T is electrically connected with the first electrode of the photodiode L1. The second electrode of the driving transistor T is electrically connected with a digital signal terminal Data.

Specifically, as shown in FIG. 6, under the irradiation of the ambient light, holes in the photodiodes L1 are accumulated to the first electrodes of the photodiodes L1, and holes of the compensation photodiodes L2 are accumulated to the first electrodes of the compensation photodiodes L2. Since the photodiodes L1 and the compensation photodiodes L2 have the opposite bias polarities, the photodiodes L1 and the compensation photodiodes L2 form opposite potentials. Since the photodiodes L1 and the compensation photodiodes L2 are connected in series, the potential of the compensation photodiodes L2 prevents the potential of the photodiodes L1 from being transmitted to the bias voltage lines Bias. Thus, the bias voltage lines Bias would have no potential, and no electrochemical corrosion would occur, thereby prolonging the service life of the product and improving the reliability of the product.

In specific implementation, as shown in FIG. 6, during photoelectric detection, a positive voltage is input into the first electrodes of the compensation photodiodes L2 through the input terminals 300. It is assumed that the input terminals 300 input a voltage of +5 V, and in this way, the second electrodes of the photodiodes L1 is in a floating state, so that the voltage of the second electrodes of the photodiodes L1 may be more than +5 V or less than +5 V. It is assumed that the voltage of the second electrodes of the photodiodes L1 is more than +5 V, such as +10 V. Since the compensation photodiodes L2 have a one-way conduction characteristic, when the voltage of +5 V is input into the first electrodes of the compensation photodiodes L2 through the input terminals 300, the one-way conduction characteristic may enable the voltage of the second electrodes of the compensation photodiodes L2, i.e., the voltage of the second electrodes of the photodiodes L1, to be +5 V, so that the compensation photodiodes L2 may not affect an external bias of the second electrodes of the photodiodes L1. Similarly, when it is assumed that the voltage of the second electrodes of the photodiodes L1 is less than +5 V, the one-way conduction characteristic may also enable the voltage of the second electrodes of the photodiodes L1 to be +5 V, so that the compensation photodiodes L2 may not affect the external bias of the first electrodes of the photodiodes L1.

In some embodiments, in an implementation, in the above detection substrate according to the embodiment of the present disclosure, the photodiode and the compensation photodiode have the same film layers and in same layer, same film layers are disposed in same layers. For example, the first electrodes of the photodiodes and the first electrodes of the compensation photodiodes may be disposed in the same layers, photoelectric conversion layers of the photodiodes and photoelectric conversion layers of the compensation photodiodes may be disposed in the same layers, and the second electrodes of the photodiodes and the second electrodes of the compensation photodiodes may be disposed in the same layers. A specific manufacturing process is the same as an existing manufacturing process, and no detailed descriptions will be made here. Therefore, patterns of film layers, having the same functions, of the photodiodes and the compensation photodiodes may be formed through one pattern process, so that a manufacturing process procedure may be simplified, the production cost is saved, and production efficiency is improved.

Based on the same inventive concept, the embodiment of the present disclosure further provides a detection panel, including any one of the detection substrates provided by the embodiments of the present disclosure, and a scintillator layer located on a light entering side of the detection substrate. The scintillator layer only covers the detection region. In an implementation, during photo detection, since the scintillator layer only covers the detection region, visible light emitted by the scintillator layer would not irradiate the compensation photoelectric diodes in the non-detection region, and the compensation photodiodes would not absorb the visible light emitted by the scintillator layer and would not affect normal photo detection. Furthermore, the detection panel is placed under a dark environment during the photo detection, and external ambient light would not irradiate the photodiodes and the compensation photodiodes, either, so that the compensation photodiodes in the detection panel provided by the present disclosure may not affect the normal photo detection.

Based on the same inventive concept, the embodiment of the present disclosure further provides a photo detection device, including the above detection panel provided by the embodiment of the present disclosure. The principle of the photo detection device for solving problems is similar to that of the above-mentioned detection substrate, so that the implementation of the photo detection device may refer to the implementation of the detection substrate, and repeated descriptions will be omitted.

The detection substrate, the detection panel and the photo detection device provided by the embodiments of the present disclosure are unavoidably exposed to the ambient light during the manufacturing of the detection substrate (such as processing, assembling and transportation), and the photoelectric conversion circuits generate a voltage when they are illuminated by the ambient light. The voltage is transmitted to the bias voltage lines, so that the bias voltage lines have a potential. Since each film layer of the detection substrate generally uses a pattern process in the preparation process, and the pattern process requires development, stripping and other processes, a developing or stripping solution will be unavoidably left on the detection substrate. Therefore, when the bias voltage lines contact the developing or stripping solution, the potential on the bias voltage lines provides kinetic energy for its electrochemical corrosion. The voltage compensation circuits are disposed between the input terminals and the bias voltage lines. Under the irradiation of the ambient light, the voltage compensation circuits and the photoelectric conversion circuits generate opposite voltages. Therefore, the voltage compensation circuits may offset the voltage generated by the photoelectric conversion circuits under the ambient light in the manufacturing process of the detection substrate to avoid potential accumulation on the bias voltage lines, thereby solving the problem that the bias voltage lines having the potential are easily electrochemically corroded in an environment with the developing or stripping solution, prolonging the service life of the product, and improving the reliability of the product.

Obviously, those skilled in the art can make various modifications and variations to the present disclosure without departing from the spirit and scope of the present disclosure. By doing this, if these modifications and variations to the present disclosure belong to the claims of the present disclosure and the scope of equivalent techniques thereof, the present disclosure also intends to include these modifications and variations inside.

The invention claimed is:

1. A detection substrate, comprising: a detection region and a non-detection region surrounding the detection region, wherein:
   the detection region comprises a plurality of detection units in an array and a plurality of bias voltage lines; each of the detection units comprises: a driving circuit, and a photoelectric conversion circuit electrically connected with the driving circuit; wherein the bias voltage lines are electrically connected with the photoelectric conversion circuits;
   the non-detection region comprises: input terminals electrically connected with the bias voltage lines, and voltage compensation circuits electrically connected between the input terminals and the bias voltage lines; and
   the voltage compensation circuits are configured to offset a voltage generated by the photoelectric conversion circuits under ambient light in a manufacturing process of the detection substrate.

2. The detection substrate according to claim 1, wherein each column of detection units is correspondingly electrically connected with the same bias voltage line, and one voltage compensation circuit is electrically connected between each of the input terminals and the corresponding bias voltage line.

3. The detection substrate according to claim 1, wherein the photoelectric conversion circuit comprises a photodiode, and the voltage compensation circuit comprises a compensation photodiode; and
   the photodiode and the compensation photodiode have opposite bias polarities.

4. The detection substrate according to claim 3, wherein a first electrode of the photodiode is electrically connected with a first electrode of the compensation photodiode; a second electrode of the compensation photodiode is electrically connected with the corresponding input terminal, and a second electrode of the photodiode is electrically connected with the corresponding driving circuit; and the bias voltage line is configured to load a negative voltage to the first electrode of the photodiode.

5. The detection substrate according to claim 4, wherein the driving circuit comprises a driving transistor; a gate of the driving transistor is electrically connected with a control signal terminal; a first electrode of the driving transistor is electrically connected with the second electrode of the photodiode; and a second electrode of the driving transistor is electrically connected with a digital signal terminal.

6. The detection substrate according to claim 3, wherein a second electrode of the photodiode is electrically connected with a second electrode of the compensation photodiode; a first electrode of the compensation photodiode is electrically connected with the corresponding input terminal, and a first electrode of the photodiode is electrically connected with the corresponding driving circuit; and the bias voltage line is configured to load a positive voltage to the second electrode of the photodiode.

7. The detection substrate according to claim 6, wherein the driving circuit comprises a driving transistor; a gate of the driving transistor is electrically connected with a control signal terminal; a first electrode of the driving transistor is electrically connected with the first electrode of the photodiode; and second electrode of the driving transistor is electrically connected with a digital signal terminal.

8. The detection substrate according to claim 3, wherein the photodiode and the compensation photodiode have same film layers and are in same layer.

9. A detection panel, comprising the detection substrate according to claim 1, and a scintillator layer on a light entering side of the detection substrate, wherein the scintillator layer only covers the detection region.

10. A photo detection device, comprising the detection panel according to claim 9.

* * * * *